(12) United States Patent
Furumiya et al.

(10) Patent No.: US 6,177,692 B1
(45) Date of Patent: Jan. 23, 2001

(54) SOLID-STATE IMAGE SENSOR OUTPUT MOSFET CIRCUIT

(75) Inventors: Masayuki Furumiya; Keisuke Hatano; Yasutaka Nakashiba, all of Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/382,644

(22) Filed: Aug. 25, 1999

(30) Foreign Application Priority Data

Aug. 27, 1998 (JP) .................................. 10-241558

(51) Int. Cl.[7] .......................... G11C 19/28; H01L 29/768
(52) U.S. Cl. .............................. 257/239; 257/386; 377/60
(58) Field of Search .................................. 257/239, 386, 257/387, 389; 377/60

(56) References Cited

U.S. PATENT DOCUMENTS

| | | | |
|---|---|---|---|
| 5,029,190 | * 7/1991 | Narabu et al. | 257/239 |
| 5,192,920 | * 3/1993 | Nelson et al. | 377/59 |
| 5,432,364 | * 7/1995 | Ohki et al. | 377/60 |
| 5,495,116 | * 2/1996 | Funakoshi et al. | 257/239 |
| 5,646,428 | * 7/1997 | Hamada | 257/239 |
| 5,945,697 | * 8/1999 | Kuno et al. | 257/239 |

OTHER PUBLICATIONS

W.F. Kosonocky et al., Two–Phase Charge–Coupled Devices with Overlapping Polysilicon and Aluminum Gates, RCA Review, vol. 34, Mar. 1973, pp. 164–202 with Abstract.

* cited by examiner

Primary Examiner—Gene M. Munson
(74) Attorney, Agent, or Firm—Sughrue, Mion, Zinn, Macpeak & Seas, PLLC

(57) ABSTRACT

There is provided a solid-state image sensor including (a) a photoelectric converter which converts light into electric charges, (b) a transfer section which transfers the electric charges, (c) a floating diffusion layer which converts the transferred electric charges into a voltage, and (d) a multi-staged source follower circuit which amplifies and then outputs the voltage, a distance L2 between a wiring through which drain potential is supplied and a gate electrode in a first-stage MOSFET being longer than the same in second or later MOSFETs. In accordance with the solid-state image sensor, it is possible to reduce a capacity of a gate electrode in a first-stage MOSFET, which ensures high sensitivity even in a solid-state image sensor having small-sized pixels which deal with a small quantity of electric charges.

15 Claims, 4 Drawing Sheets

SOLID-STATE IMAGE SENSOR OUTPUT MOSFET CIRCUIT

BACKGROUND OF THE INVENTION

1. Field of the Invention

The invention relates to a solid-state image sensor, and more particularly to a solid-state image sensor having small-sized pixels which deal with a small quantity of electric charges.

2. Description of the Related Art

An apparatus for transferring electric charges is generally designed to have an output circuit comprised of a multi-staged MOSFET. The apparatus accumulates electric charges having been transferred through an electric charge transfer section, in a detection capacity, and amplifies and outputs fluctuation in potential in the detection capacity. As such an apparatus for transferring electric charges, there have been known an apparatus including MOSFET having a floating diffusion layer for detecting signal electric charges, and MOSFET having a gate electrode electrically connected to the floating diffusion layer through a wiring layer, and constituting a source follower circuit.

For instance, one of such apparatuses is suggested in "Two Phase Charge Coupled Devices with Overlapping Polysilicon and Aluminum Gates", Kosonocky W. F. and Cames J. E., RCA Review, Vol. 34, 1973, pp. 164–202.

FIG. 1 is a cross-sectional view of a conventional solid-state image sensor. The illustrated solid-state image sensor is comprised of a light-electricity converting section (not illustrated) in which light is converted into electricity, a three-phase driven electric charge transfer section 10 for transferring electric charges therethrough, a signal electric charge detector 16 including MOSFET 14 for resetting, and a two-staged source follower circuit comprised of a first-stage source follower circuit 18 and a second-stage source follower circuit 20.

With reference to FIG. 1, the three-phase driven electric charge transfer section 10 is comprised of a p-type semiconductor substrate 22, an n-type semiconductor region 24 formed in the semiconductor substrate 22, electric charge transfer electrodes 26, 28 and 30 to which transfer pulses $\phi 1$, $\phi 2$, $\phi 3$ are applied, respectively, and a gate electrode 32 to which a low voltage Vog generated at an output end of the electric charge transfer section 10 is applied.

The signal electric charge detector 16 is comprised of the p-type semiconductor substrate 22, a floating diffusion layer 12 formed in the semiconductor substrate 22, the an n-type semiconductor region 24 formed in the semiconductor substrate 22, an n+ semiconductor region 36 electrically connected to a reset voltage source Vrd, and a reset gate electrode 34 to which a reset pulse voltage $\phi$ is applied.

The first-stage source follower circuit 18 is comprised of the p-type semiconductor substrate 22, a gate electrode 37 of first MOSFET for detecting electric charges, a gate electrode 39 of a depletion type second MOSFET acting as a load, a wiring layer 41 through which drain potential is supplied, a wiring layer 43 from which source potential of the first MOSFET is supplied, a wiring layer 45 through which source potential or ground potential of the second MOSFET is supplied, heavily doped p-type semiconductor regions 48 for electrically isolating regions in each of which a device is to be fabricated, and an interlayer insulating film 49 electrically insulating the gate electrodes 37 and 39 from others.

The second-stage source follower circuit 20 is comprised of the p-type semiconductor substrate 22, a gate electrode 38 of first MOSFET for detecting electric charges, a gate electrode 40 of a depletion type second MOSFET acting as a load, a wiring layer 42 through which drain potential is supplied, a wiring layer 44 from which source potential of the first MOSFET is supplied, a wiring layer 46 through which source potential or ground potential of the second MOSFET is supplied, heavily doped p-type semiconductor regions 50 for electrically isolating regions in each of which a device is to be fabricated, and an interlayer insulating film 51 electrically insulating the gate electrodes 38 and 40 from others.

The floating diffusion layer 12 of the signal electric charge detector 16 is electrically connected to the gate electrode 37 of the first-stage source follower circuit 18 through a wiring 53.

A drain voltage source Vdd is electrically connected to the wiring layers 41 and 42 in the first- and second-stage source follower circuits 18 and 20. The wiring layer 43 from which a source voltage in the first-stage source follower circuit 18 is supplied is electrically connected to the gate electrode 38 of the second-stage source follower circuit 20. The wiring layer 44 from which a source voltage in the second-stage source follower circuit 20 is supplied is electrically connected to a signal output terminal 52.

Assuming that an electric charge detecting capacity including the gate electrode 37 electrically connected to the floating diffusion layer 12 of the signal electric charge detector 16 is represented as Cfd, and a quantity of signal electric charges having been transferred is represented as Qsig, there is generated fluctuation $\Delta$Vfd in the floating diffusion layer 12. Herein, the fluctuation $\Delta$Vfd is defined as Qsig/Cfd($\Delta$Vfd=Qsig/Cfd).

The fluctuation $\Delta$Vfd varies a gate voltage in the gate electrodes of the first MOSFETs in the first- and second-stage source follower circuits 18 and 20. As a result, variation in a voltage, which is in proportion to a quantity of signal electric charges Qsig, is detected in the output terminal 52.

In recent solid-state image sensors, it is necessary to ensure a sufficient S/N ratio in image signals, that is, to reduce an electric charge detecting capacity in order to enhance detection sensitivity.

However, since the conventional solid-state image sensor is designed to have a non-planarized thin interlayer insulating film 49 for preventing occurrence of smear, as illustrated in FIG. 2, influence of a capacity between a gate and a wiring on the electric charge detecting capacity is not ignorable.

The above-mentioned capacity between a gate and a wiring corresponds to a capacity between the gate electrode 37 and the wiring layers 41 and 43 in the first-stage source follower circuit 18, and also corresponds to a capacity between the gate electrode 38 and the wiring layers 42 and 44 in the second-stage source follower circuit 20.

The capacities are influenced by a distance between a gate electrode and a wiring layer. In FIG. 1, a distance between the wiring layer 41 to which the drain voltage Vdd is applied and the gate electrode 37 in the first-stage source follower circuit 18 is represented as L1, and a distance between the wiring layer 42 to which the drain voltage Vdd is applied and the gate electrode 38 in the second-stage source follower circuit 20 is represented also as L1.

In FIG. 1, the wiring layer 41 is illustrated as spaced away from the gate electrode 37 for the purpose of explanation. However, the wiring layer 41 is formed actually in such a manner that the wiring layer 41 extends to a location above the gate electrode 37 with the interlayer insulating film 49 being sandwiched therebetween, as illustrated in FIG. 2. As a result, the distance L1 is nearly equal to zero.

The conventional solid-state image sensor having the above-mentioned structure is accompanied with a problem that it would be impossible to have high sensitivity due to-insufficient reduction in an electric charge detecting capacity, if the solid-state image sensor had small-sized pixels which deal with a small quantity of electric charges.

SUMMARY OF THE INVENTION

In view of the above-mentioned problem, it is an object of the present invention to provide a solid-state image sensor which is capable of sufficiently reducing an electric charge detecting capacity to thereby ensure high sensitivity, even if it has small-sized pixels which deal with a small quantity of electric charges.

There is provided an apparatus for transferring electric charges, including a plurality of MOSFETs wherein a distance L2 between a wiring through which drain potential is supplied and a gate electrode in a first-stage MOSFET is longer than the same in second- or later-stage MOSFETs.

There is further provided a solid-state image sensor including an output circuit comprised of a plurality of MOSFETs which amplify and output fluctuation in potential in a capacity, a distance L2 between a wiring through which drain potential is supplied and a gate electrode in a first-stage MOSFET being longer than the same in second- or later-stage MOSFETs.

It is preferable that the distance L2 is greater than 0 $\mu$m and equal to or smaller than 30 $\mu$m (0 $\mu$m<L2$\leq$30 $\mu$m).

If the distance L2 is greater than 0 $\mu$m, it can contribute to reduction in an electric charge detecting capacity. The distance L2 is equal to 30 $\mu$m at longest because of a limited area in layout of a device.

It is also preferable that a distance L3 between a wiring through which source potential is supplied and the gate electrode in the first-stage MOSFET is longer than the same in the second- or later-stage MOSFETs.

It is preferable that the distance L3 is greater than 0 $\mu$m and equal to or smaller than 30 $\mu$m (0 $\mu$m<L3$\leq$30 $\mu$m).

If the distance L3 is greater than 0 $\mu$m, it can contribute to reduction in an electric charge detecting capacity. The distance L3 is equal to 30 $\mu$m at longest because of a limited area in layout of a device.

It is preferable that the output circuit constitutes a source follower circuit, in which case, the source follower circuit preferably has two stages.

There is still further provided a solid-state image sensor including (a) a photoelectric converter which converts light into electric charges, (b) a transfer section which transfers the electric charges, (c) a floating diffusion layer which converts the transferred electric charges into a voltage, and (d) a multi-staged source follower circuit which amplifies and then outputs the voltage, a distance L2 between a wiring through which drain potential is supplied and a gate electrode in a first-stage MOSFET being longer than the same in second- or later-stage MOSFETs.

In accordance with the present invention, it is possible to reduce an input capacity of a gate electrode in a first-stage source follower circuit, specifically, a capacity between a gate electrode and a drain wiring and a capacity between a gate electrode and a source wiring. As a result, an electric charge detecting capacity in a floating diffusion layer can be reduced, which ensures high sensitivity even in a solid-state image sensor having small-sized pixels which deal with a small quantity of electric charges.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 3:
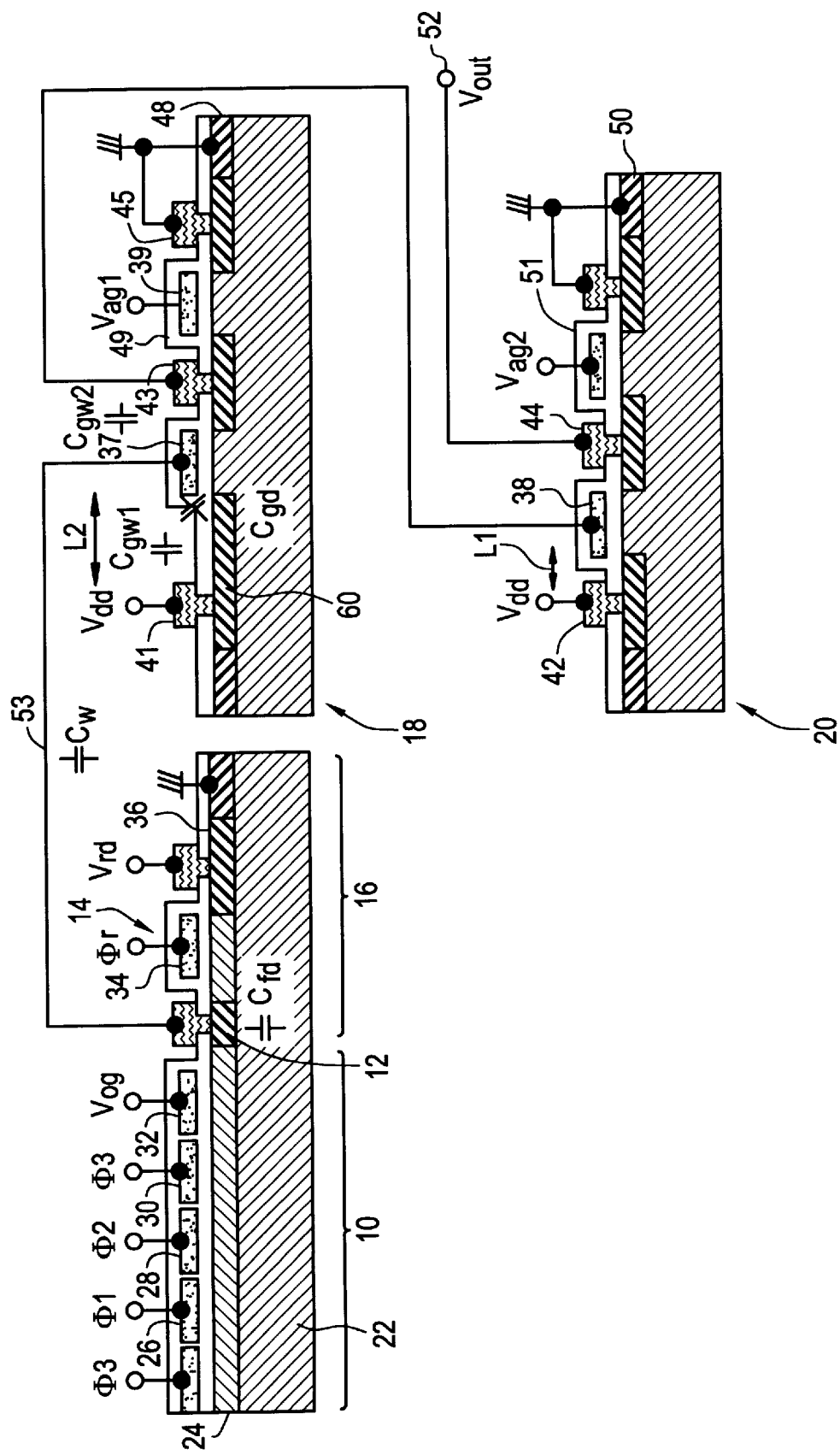
FIG. 3 is a cross-sectional view of a solid-state image sensor in accordance with the first embodiment.

FIG. 3 is a cross-sectional view of a solid-state image sensor in accordance with the first embodiment.

As illustrated in FIG. 3, the solid-state image sensor is comprised of a light-electricity converting section (not illustrated) in which light is converted into electricity, a three-phase driven electric charge transfer section 10 for transferring electric charges therethrough, a signal electric charge detector 16 including MOSFET 14 for resetting, and a two-staged source follower circuit comprised of a first-stage source follower circuit 18 and a second-stage source follower circuit 20.

The three-phase driven electric charge transfer section 10 is comprised of a p-type semiconductor substrate 22, an n-type semiconductor region 24 formed in the semiconductor substrate 22, electric charge transfer electrodes 26, 28 and 30 to which transfer pulses $\phi 1$, $\phi 2$, $\phi 3$ are applied, respectively, and a gate electrode 32 to which a low voltage Vog generated at an output end of the electric charge transfer section 10 is applied.

The signal electric charge detector 16 is comprised of the p-type semiconductor substrate 22, a floating diffusion layer 12 formed in the semiconductor substrate 22, the an n-type semiconductor region 24 formed in the semiconductor substrate 22, an n+ semiconductor region 36 electrically connected to a reset voltage source Vrd, and a reset gate electrode 34 to which a reset pulse voltage $\phi$ is applied.

The first-stage source follower circuit 18 is comprised of the p-type semiconductor substrate 22, a gate electrode 37 of first MOSFET for detecting electric charges, a gate electrode 39 of a depletion type second MOSFET acting as a load, a wiring layer 41 through which drain potential is supplied, a wiring layer 43 from which source potential of the first MOSFET is supplied, a wiring layer 45 through which source potential or ground potential of the second MOSFET is supplied, heavily doped p-type semiconductor regions 48 for electrically isolating regions in each of which a device is to be fabricated, and an interlayer insulating film 49 electrically insulating the gate electrodes 37 and 39 from others.

The second-stage source follower circuit 20 is comprised of the p-type semiconductor substrate 22, a gate electrode 38 of first MOSFET for detecting electric charges, a gate electrode 40 of a depletion type second MOSFET acting as a load, a wiring layer 42 through which drain potential is supplied, a wiring layer 44 from which source potential of the first MOSFET is supplied, a wiring layer 46 through which source potential or ground potential of the second MOSFET is supplied, heavily doped p-type semiconductor regions 50 for electrically isolating regions in each of which a device is to be fabricated, and an interlayer insulating film 51 electrically insulating the gate electrodes 38 and 40 from others.

The floating diffusion layer 12 of the signal electric charge detector 16 is electrically connected to the gate electrode 37 of the first-stage source follower circuit 18 through a wiring 53.

A drain voltage source Vdd is electrically connected to the wiring layers 41 and 42 in the first- and second-stage source follower circuits 18 and 20. The wiring layer 43 from which a source voltage in the first-stage source follower circuit 18 is supplied is electrically connected to the gate electrode 38 of the second-stage source follower circuit 20. The wiring layer 44 from which a source voltage in the second-stage source follower circuit 20 is supplied is electrically connected to a signal output terminal 52.

Figure 1:
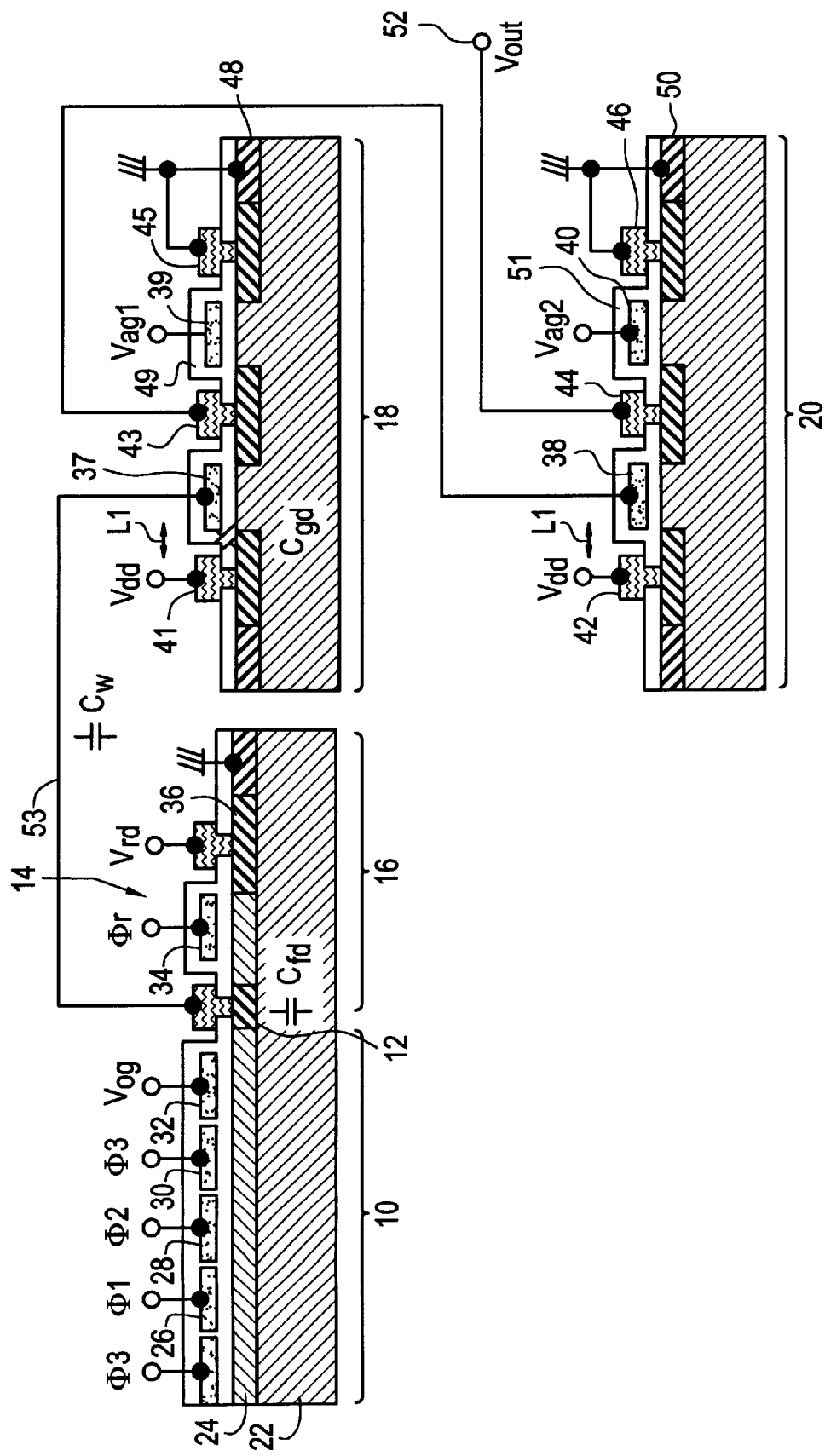
FIG. 1 is a cross-sectional view of a conventional solid-state image sensor.
Figure 2:
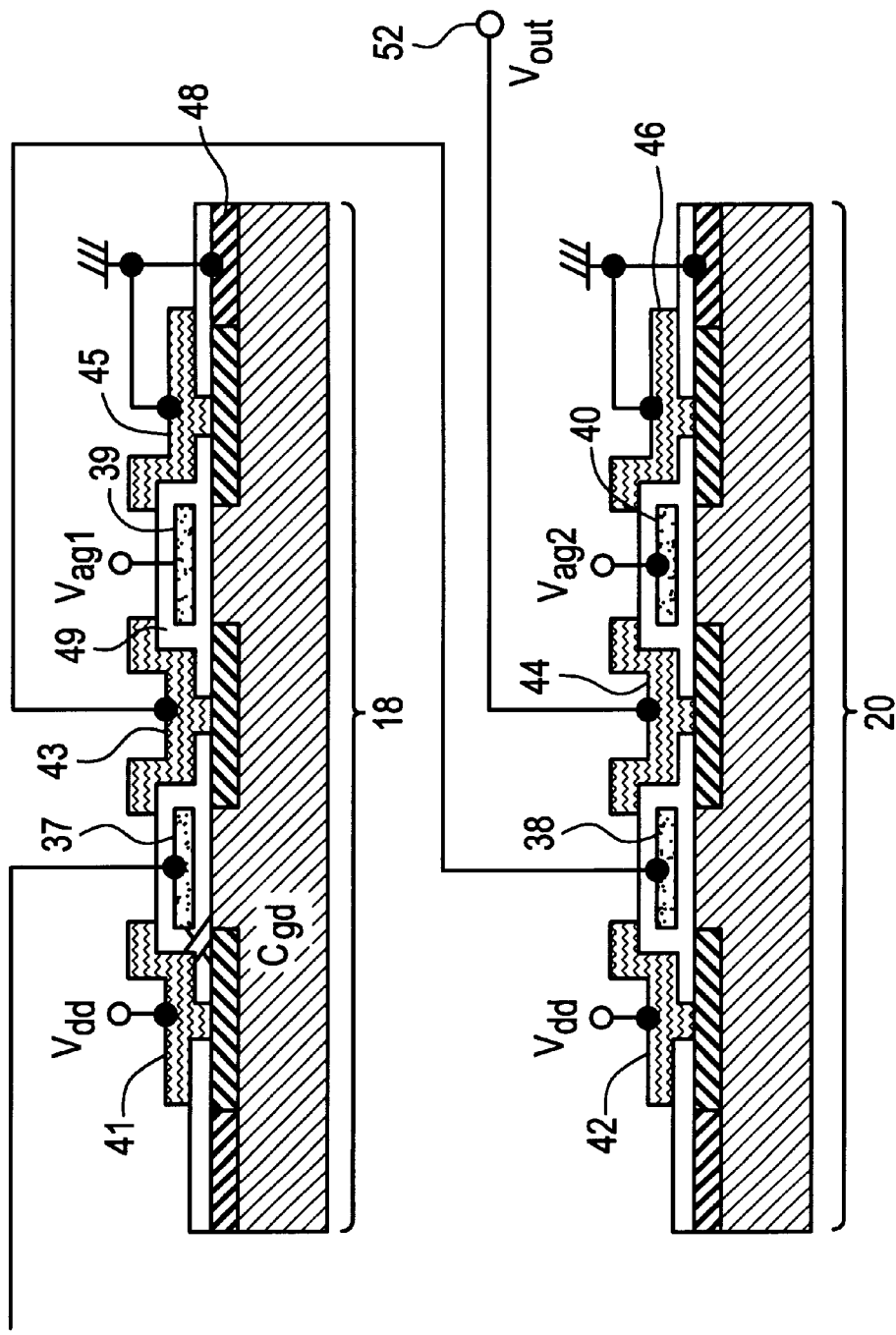
FIG. 2 is a cross-sectional view of a conventional solid-state image sensor.

In the solid-state image sensor in accordance with the first embodiment, a distance L2 between the wiring layer 41 to which the drain voltage Vdd is applied and the gate electrode 37 in the first-stage source follower circuit 18 is designed to be longer than a distance L1 between the wiring layer 42 to which the drain voltage Vdd is applied and the gate electrode 38 in the second-stage source follower circuit 20. In other words, the distance L2 is designed to be longer than the same in such a conventional solid-state image sensor as illustrated in FIG. 1.

In the solid-state image sensor in accordance with the first embodiment, an electric charge detecting capacity C is defined as a sum of (a) a junction capacity Cfd between the floating diffusion layer 12 and the p-type semiconductor substrate 22, (b) a wiring capacity Cw between the floating diffusion layer 12 and the gate electrode 37 in the first-stage source follower circuit 18, (c) an input capacity Cgw of the gate electrode 37, and (d) a capacity Cgd between the gate electrode 37 and a drain region 60 extending between the wiring layer 41 and the gate electrode 37.

$$C = Cfd + Cw + Cgw + Cgd$$

Assuming that the first MOSFET for detecting electric charges in the first-stage source follower circuit 18 is constituted as a n-type channel transistor, the input capacity Cgw of the gate electrode 37 is defined as follows.

$$Cgw = Cgw1 + (1-G) \times Cgw2$$

wherein G represents a gain, Cgw1 represents a capacity between the gate electrode 37 and the drain wiring layer 41, and Cgw2 represents a capacity between the gate electrode 37 and the wiring layer 43 through which a source voltage is supplied.

Since a gain G of a source follower circuit is equal to about 0.90, the input capacity Cgw of the gate electrode 37 is influenced more greatly by the capacity Cgw1 than by the capacity Cgw2.

In accordance with the first embodiment, the distance L2 between the wiring layer 41 to which the drain voltage Vdd is applied and the gate electrode 37 in the first-stage source follower circuit 18 is longer than the distance L1 between the wiring layer 42 to which the drain voltage Vdd is applied and the gate electrode 38 in the second-stage source follower circuit 20.

As a result, it is possible to reduce the input capacity Cgw of the gate electrode 37 in the first-stage source follower circuit 18, ensuring reduction in the electric charge detecting capacity C.

The inventors conducted the experiment to verify that the solid-state image sensor in accordance with the first embodiment really could reduce the electric charge detecting capacity C. In the experiment, the inventor fabricated two solid-state image sensors. In the first solid-state image sensor, the distances L2 and L1 were designed to be equal to zero. In the second solid-state image sensor, the distance L2 was designed to be equal to 10.0 $\mu$m, and the distance L1 was designed to be equal to zero. That is, the first solid-state image sensor was a conventional one, and the second solid-state image sensor was one in accordance with the first embodiment. The second solid-state image sensor reduced the electric charge detecting capacity C by 15% in comparison with the first solid-state image sensor.

Figure 4:
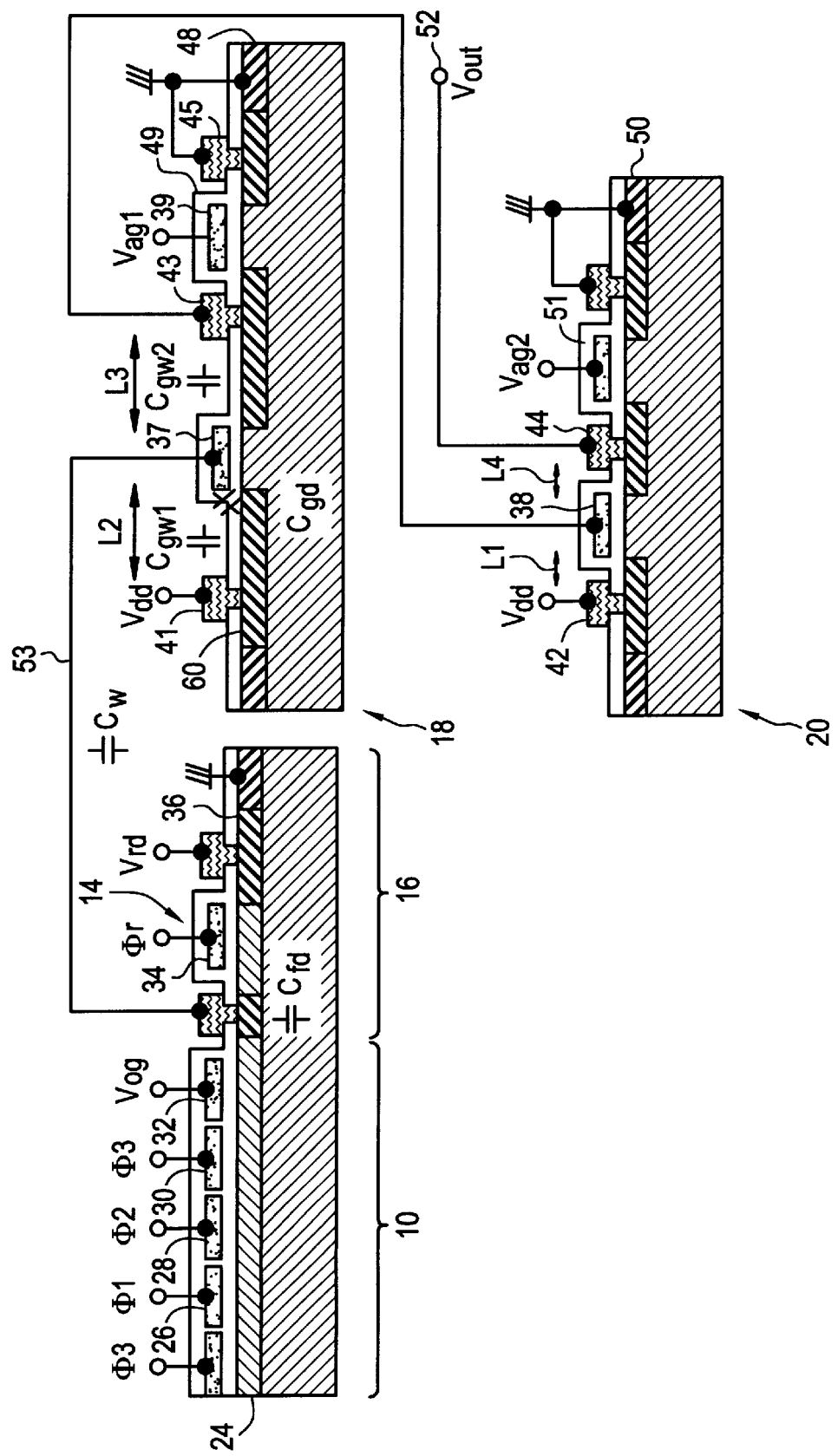
FIG. 4 is a cross-sectional view of a solid-state image sensor in accordance with the second embodiment.

FIG. 4 is a cross-sectional view of a solid-state image sensor in accordance with the second embodiment.

The solid-state image sensor in accordance with the second embodiment has the same structure as that of the solid-state image sensor in accordance with the first embodiment. Parts or elements that correspond to those of the solid-state image sensor illustrated in FIG. 3 have been provided with the same reference numerals.

The solid-state image sensor in accordance with the second embodiment is structurally different from the solid-state image sensor in accordance with the first embodiment only in that a distance L3 between the wiring layer 43 through which a source voltage of the first MOSFET is supplied and the gate electrode 37 in the first-stage source follower circuit 18 is designed to be longer than a distance L4 between the wiring layer 44 through which a source voltage of the first MOSFET is supplied and the gate electrode 38 in the second-stage source follower circuit 20.

In accordance with the second embodiment, it is possible to further reduce the electric charge detecting capacity C.

The inventors conducted the experiment to verify that the solid-state image sensor in accordance with the second embodiment really could reduce the electric charge detecting capacity C. In the experiment, the inventor fabricated two solid-state image sensors. In the first solid-state image sensor, the distances L2 were designed to be equal to 10 $\mu$m, and the distances L1, L3 and L4 were designed to be equal to zero. In the second solid-state image sensor, the distances L2 and L3 were designed to be equal to 10 $\mu$m, and the distances L1 and L4 were designed to be equal to zero. That is, the first solid-state image sensor was one in accordance with the first embodiment, and the second solid-state image sensor was one in accordance with the second embodiment. The second solid-state image sensor reduced the electric charge detecting capacity C by 10% in comparison with the first solid-state image sensor.

In the above-mentioned first and second embodiments, the source follower circuit is designed to have two stages. However, it should be noted that the source follower circuit may be designed to have three or more stages. If the source follower circuit is designed to have three or more stages, the distance L2 in the first-stage source follower circuit 18 is designed to be longer than the distance L1 in the second- and later-stage source follower circuits, and the distance L3 in the first-stage source follower circuit 18 is designed to be longer than the distance L4 in the second- and later-stage source follower circuits.

In the above-mentioned first and second embodiments, the source follower circuit is employed as an output circuit. However, it should be noted that any other amplifier circuit may be employed as an output circuit.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-241558 filed on Aug. 27, 1998 including specification, claims, drawings and summary is incorporated herein by reference in its entirety.

What is claimed is:

1. An apparatus for transferring electric charges, comprising a plurality of MOSFETs wherein a distance L2 between a wiring through which drain potential is supplied and a gate electrode in a first-stage MOSFET is longer than the same in second- or later-stage MOSFETs.

2. The apparatus as set forth in claim 1, wherein said distance L2 is greater than 0 $\mu$m and equal to or smaller than 30 $\mu$m (0 $\mu$m<L2$\leq$30 $\mu$m).

3. The apparatus as set forth in claim 1, wherein a distance L3 between a wiring through which source potential is supplied and said gate electrode in said first-stage MOSFET is longer than the same in said second or later MOSFETs.

4. The apparatus forth in claim 3, wherein said distance L3 is greater than 0 $\mu$m and equal to or smaller than 30 $\mu$m (0 $\mu$m<L3$\leq$30 $\mu$m).

5. A solid-state image sensor including an output circuit comprised of a plurality of MOSFETs which amplify and output fluctuation in potential in a capacity, a distance L2 between a wiring through which drain potential is supplied and a gate electrode in a first-stage MOSFET being longer than the same in second- or later-stage MOSFETs.

6. The solid-state image sensor as set forth in claim 5, wherein said distance L2 is greater than 0 $\mu$m and equal to or smaller than 30 $\mu$m (0 $\mu$m<L2$\leq$30 $\mu$m).

7. The solid-state image sensor as set forth in claim 5, wherein a distance L3 between a wiring through which source potential is supplied and said gate electrode in said first-stage MOSFET is longer than the same in said second- or later-stage MOSFETs.

8. The solid-state image sensor as set forth in claim 7, wherein said distance L3 is greater than 0 $\mu$m and equal to or smaller than 30 $\mu$m (0 $\mu$m<L3$\leq$30 $\mu$m).

9. The solid-state image sensor as set forth in claim 5, wherein said output circuit constitutes a source follower circuit.

10. The solid-state image sensor as set forth in claim 9, wherein said source follower circuit has two stages.

11. A solid-state image sensor comprising:
    (a) a photoelectric converter which converts light into electric charges;
    (b) a transfer section which transfers said electric charges;
    (c) a floating diffusion layer which converts the transferred electric charges into a voltage; and
    (d) a multi-staged source follower circuit which amplifies and then outputs said voltage, a distance L2 between a wiring through which drain potential is supplied and a gate electrode in a first-stage MOSFET being longer than the same in second- or later-stage MOSFETs.

12. The solid-state image sensor as set forth in claim 11, wherein said distance L2 is greater than 0 $\mu$m and equal to or smaller than 30 $\mu$m (0 $\mu$m<L2$\leq$30 $\mu$m).

13. The solid-state image sensor as set forth in claim 11, wherein a distance L3 between a wiring through which source potential is supplied and said gate electrode in said first-stage MOSFET is longer than the same in said second- or later-stage MOSFETs.

14. The solid-state image sensor as set forth in claim 13, wherein said distance L3 is greater than 0 $\mu$m and equal to or smaller than 30 $\mu$m (0 $\mu$m<L3$\leq$30 $\mu$m).

15. The solid-state image sensor as set forth in claim 11, wherein said source follower circuit has two stages.

* * * * *